United States Patent [19]

Yoshitake et al.

[11] Patent Number: 4,922,290
[45] Date of Patent: May 1, 1990

[54] SEMICONDUCTOR EXPOSING SYSTEM HAVING APPARATUS FOR CORRECTING CHANGE IN WAVELENGTH OF LIGHT SOURCE

[75] Inventors: Yasuhiro Yoshitake, Yokohama; Yoshitada Oshida, Fujisawa, both of Japan

[73] Assignee: Hitachi, Ltd., Tokyo, Japan

[21] Appl. No.: 253,562

[22] Filed: Oct. 5, 1988

[30] Foreign Application Priority Data

Oct. 6, 1987 [JP] Japan .................................. 62-250585

[51] Int. Cl.$^5$ ....................... G03B 27/42; G03B 27/52
[52] U.S. Cl. ........................................ 355/53; 355/55; 355/77
[58] Field of Search ....................... 355/53, 67, 43, 77; 250/201

[56] References Cited

U.S. PATENT DOCUMENTS 4,703,166 10/1987 Bruning ................................ 250/201

FOREIGN PATENT DOCUMENTS 0066053 12/1982 European Pat. Off. ............... 355/53

OTHER PUBLICATIONS

"Photo-etching of PMMA by Excimer Loser Irradiation" by Kawamura et al., vol. 8, No. 6, Study on Laser, pp. 69-71.
"Excimer Laser-based Lithography" by Victor Pol et al., Proceedings of SPIE.
"High Precision Wavelength Meter with Fabry-Perot Optics" by Konishi et al., vol. 25, Applied Physics, pp. 311-316, (1981).

Primary Examiner—Richard A. Wintercorn
Assistant Examiner—D. Rutledge
Attorney, Agent, or Firm—Antonelli, Terry & Wands

[57] ABSTRACT

The invention relates to a semiconductor exposing system for projecting a pattern of a mask onto a semiconductor wafer and, more particularly, to such a system having an apparatus for correcting an influence on the resolution by a fluctuation in wavelength of a laser light source. The system of the invention comprises: a laser light source; an optical projecting system for projecting a laser beam emitted from the laser light source onto the semiconductor wafer through the mask; and an apparatus for receiving a part of the laser beam emitted from the laser light source, for detecting the wavelength fluctuation, and for correcting the position and magnification of the optical projecting system in accordance with the wavelength fluctuation value or an apparatus for correcting the refractive index of the optical projecting system.

7 Claims, 6 Drawing Sheets

SEMICONDUCTOR EXPOSING SYSTEM HAVING APPARATUS FOR CORRECTING CHANGE IN WAVELENGTH OF LIGHT SOURCE

BACKGROUND OF THE INVENTION

The present invention relates to a semiconductor exposing system for projecting a fine pattern to a semiconductor wafer and, more particularly, to a system for correcting an influence by a fluctuation of a wavelength of a short wavelength light source.

In recent years, high density of semiconductor devices have been developed. At present, the width of the thinnest line which is required in semiconductor devices is on the order of submicron. A light source of a short wavelength such as far ultraviolet rays is required to accurately project such a thin line onto a semiconductor wafer while keeping a desired resolution. Nowadays, a g-line (436 nm) or i-line (365 nm) of the spectrum of a mercury lamp is used. As the wavelength becomes short, the minimum line width which can be projected onto the wafer can be narrowed. Further, an excimer laser is known as a light source of a short wavelength. An oscillating wavelength of the excimer laser can be changed by changing the kind of oscillating medium gas. The oscillating media by which high power can be stably obtained are xenon chloride (XeCl) of a wavelength of 308 nm and krypton fluoride (KrF) of a wavelength of 248 nm.

Only synthetic quartz or calcium fluoride ($CaF_2$) can be at present used as a lens material which can transmit such a light of a short wavelength. Further, it is desirable to make a lens using only synthetic quartz in terms of the uniformity and stability of the material.

A spectrum width of the oscillating output light of the excimer laser is 0.3 nm. To obtain high enough resolution to expose a mask pattern onto a wafer using the light source of such a spectrum width, the chromatic aberration must be corrected. To correct the chromatic aberration, at least two kinds of materials having different refractive indices and Abbe's Numbers are needed. However, only one kind of synthetic quartz is available as a practical lens material which transmits the light of the excimer laser, so that it is impossible to correct the chromatic aberration.

There has been proposed a method whereby the correction of the chromatic aberration becomes unnecessary by narrowing the band of the output light of the excimer laser. The narrow spectrum can be selectively taken out by inserting a wavelength tuning device such as a combination of prisms and a diffraction grating into a laser resonator. An excimer laser exposing apparatus using an etalons as a wavelength tuning device is disclosed in Victor Pol et al., "Excimer laser-based lithography" in Proceedings of SPIE, Optical Microlithography, V(1986).

To obtain a narrow band laser beam having a desired central wavelength, the geometrical position of the wavelength tuning device in the resonator must be accurately held. However, the device is deformed by a change in ambient temperature of the wavelength tuning device, so that the center wavelength of the output beam is shifted. The lens for reducing a mask pattern and projecting onto a wafer is designed such that its optical performance is made effective at a certain special wavelength. Therefore, if the center wavelength of the light source is shifted, the projected pattern becomes dim or a reduction ratio changes, so that the size of the projected pattern varies. These items are large contributors to a deterioration of the manufacturing yield of the semiconductor devices. Therefore, in a projection type exposing system using a wavelength tuning device in a laser light source, a change in parameter of the optical system, i.e., image forming position which is caused due to a fluctuation in wavelength needs to be corrected.

SUMMARY OF THE INVENTION

It is an object of the present invention to provide a semiconductor exposing system for projecting a mask pattern onto a semiconductor wafer and, more particularly, to provide such a system having an apparatus for correcting an the influence of a fluctuation in wavelength of a light source of a short wavelength.

A semiconductor exposing system in an embodiment of the present invention for accomplishing the above object comprises: a laser light source; an optical projecting system for projecting a laser beam emitted from the laser light source onto a semiconductor wafer through a mask; a wavelength measuring instrument for receiving a part of the laser beam emitted from the laser light source and generating an output signal corresponding to a wavelength of the laser beam; and an apparatus for receiving the output signal of the wavelength measuring instrument, for detecting a fluctuation in wavelength of the laser beam, and for correcting both of a distance between the optical projecting system and the wafer and a magnification of the optical projecting system in accordance with the value of the fluctuation in wavelength. According to the system with this structure, the distance between the optical projecting system and the wafer is adjusted in accordance with a change amount of the wavelength of the laser light source, thereby locating the wafer to the correct focal point position. At the same time, the distance between the mask and the optical projecting system and the reduction ratio are adjusted. These adjustments prevent the pattern from becoming dim and that the size of pattern from changing.

A semiconductor exposing system according to still another embodiment of the invention comprises: a laser light source; an optical projecting system for projecting a laser beam emitted from the laser light source onto a semiconductor wafer through a mask; a wavelength measuring instrument for receiving a part of the laser beam emitted from the laser light source and for generating an output signal corresponding to a wavelength of the laser beam; and an apparatus for receiving the output signal of the wavelength measuring instrument, for detecting a fluctuation in wavelength of the laser beam, and for correcting a focal distance of the optical projecting system in accordance with the value of the fluctuation of the wavelength. According to the system with such a structure, in accordance with a wavelength change amount of the laser light source, a refractive index of the optical projecting system is adjusted and the pattern is accurately projected onto the wafer, thereby preventing that the pattern from becoming dim and the size of pattern from changing.

DESCRIPTION OF THE PREFERRED EMBODIMENTS

Figure 1:
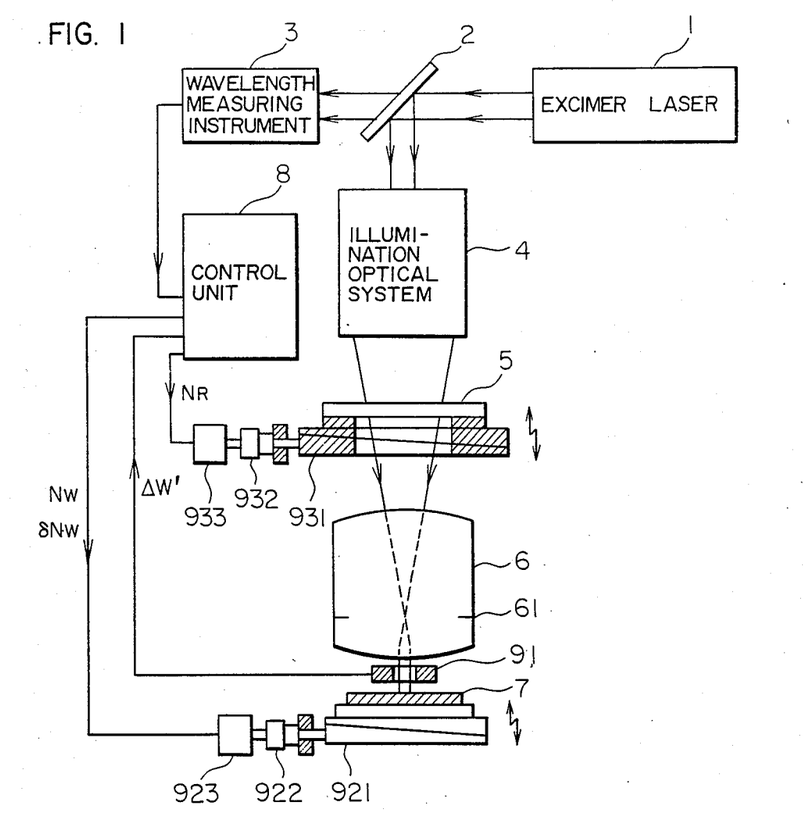
FIG. 1 is a diagram showing a whole arrangement of the first embodiment of a semiconductor exposing system according to the present invention.

FIG. 1 is a diagram showing a whole arrangement of a projection type semiconductor exposing system of the present invention in which an excimer laser for generating far ultraviolet rays is used as a light source. In this embodiment, a change in wavelength is detected, the position of the wafer is moved in accordance with the change amount of the wavelength, the wafer is set at the focal point position of the light emitted from a reduction lens, and at the same time, a change in magnification associated with the movement of the wafer is adjusted to a predetermined value by moving a reticle (mask). An excimer laser 1 has therein a wavelength tuning device (not shown). As a wavelength tuning device, the etalons disclosed in the foregoing literature or a device consisting of a combination of prisms and a diffraction grating has been known. Any of these devices can be also applied to the invention. A laser beam of a narrow band emitted from the excimer laser 1 is divided into two beams in different directions by a beam splitter 2. One of the two laser beams enters an illumination optical system 4 consisting of a reflecting mirror and lenses. The illumination optical system 4 allows the laser beam to pass through a pattern of a reticle 5 and converges onto a pupil surface 61 of a reduction lens 6. After that, the laser beam is projected as parallel light fluxes onto a wafer 7. The circuit pattern of the reticle (mask) 5 is transferred onto the wafer 7 at a predetermined reduction ratio.

The other laser beam divided by the beam splitter 2 enters a wavelength measuring instrument 3. The wavelength measuring instrument 3 is of the type for monitoring a wavelength of an output laser beam emitted from the excimer laser 1 and for outputting an electric signal corresponding to the wavelength value. A well-known apparatus can be used as the wavelength measuring instrument 3. An example of the wavelength measuring instrument is disclosed in N. Konishi et al., "High Precision Wavelength Meter with Fabry-Perot Optics", Applied Physics, Vol. 25, pages 311 to 316, (1981).

An output signal of the wavelength measuring instrument 3 is input to a control unit 8. The control unit 8 comprises: a well-known microcomputer including a memory and a processor; and an amplifier for amplifying an output signal of the microcomputer and generating a drive signal of a moving apparatus. Now, assuming that a design reference wavelength of the reduction lens 6 is $\lambda_0$ and an actual wavelength of the laser beam detected by the wavelength measuring instrument 3 is $\lambda$, a change amount $\Delta\lambda$ of the wavelength can be obtained by $$\Delta\lambda = \lambda - \lambda_0$$

Figure 2:
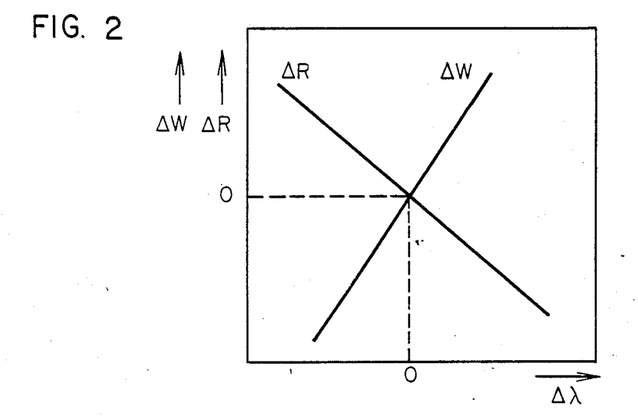
FIG. 2 is a diagram showing the relation between the reticle and the correction amount of the wafer to a change amount of a wavelength.

The focal point position of the reduction lens 6 changes due to a change in wavelength of $\Delta\lambda$. The wafer 7 is moved to the focal point position in accordance with a change in focal point position. Since a magnification of an image also simultaneously changes by the wavelength change, the reticle 5 is also moved to return the changed magnification to the original value. There is the relation as shown in FIG. 2 between a movement amount (correction amount) $\Delta W$ of the wafer in the direction of an optical axis corresponding to the waveform change amount $\Delta\lambda$ to keep the magnification and focal distance constant and a movement amount (correction amount) $\Delta R$ of the reticle. For the movement amounts $\Delta W$ and $\Delta R$ in FIG. 2, the optical axis direction directing from the wafer 7 toward the reticle 5 is set to be positive. This relation can be previously obtained by calculations or may be experimentally determined. This relation is stored in the memory in the control unit 8. A procedure for the correction control which has been programmed in the microcomputer in the control unit 8 is shown in a flowchart of FIG. 3. In step 100, the value of the actual wavelength $\lambda$ is read out of the wavelength measuring instrument 3. In step 101, the difference $\Delta\lambda$ between the reference wavelength value $\lambda_0$ stored in the memory and the actual wavelength value $\lambda$ is calculated. In step 102, the correction value $\Delta R$ of the reticle 5 corresponding to the difference $\Delta\lambda$ is read out of the memory. In step 103, the number NR of input pulses of a pulse motor 933 to move the reticle by only the distance of $\Delta R$ is determined. Assuming that a movement amount of the reticle 5 per pulse is r, the number NR of input pulses is calculated by $$NR = \Delta R / r$$

Figure 3:
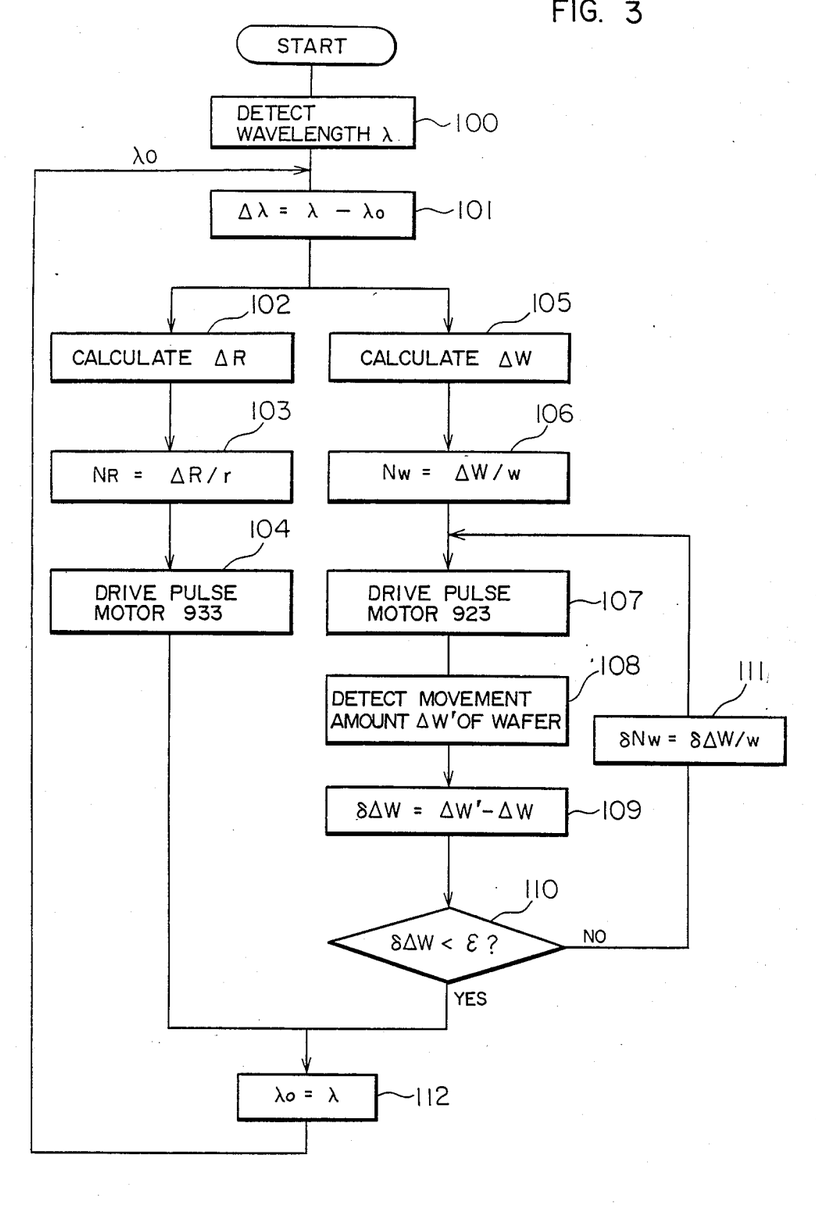
FIG. 3 is a control flowchart for the system of FIG. 1.

In step 104, the drive pulse NR is given to a pulse motor 933, so that the motor operates. The rotation of the motor 933 is converted into the reciprocating rectilinear motion by a micrometer head 932. Further, the motion of the micrometer head 932 is propagated to a wedge stage 931 connected thereto. The reticle 5 on which a pattern is fixed is put on the stage 931. When the stage 931 moves, the reticle 5 moves in the optical axis direction by only the distance of $\Delta R$.

On the other hand, in step 105, the correction value $\Delta W$ of the wafer 7 corresponding to the $\Delta\lambda$ is read out of the memory. In step 106, the number NW of input pulses of the pulse motor 923 to move the wafer by only the distance of $\Delta W$ is decided. Assuming that a movement amount of the wafer 7 per pulse is w, the number NW of input pulses is calculated by $$NW = \Delta W / w$$

In step 107, the drive pulse NW is given to the pulse motor 923, so that the motor operates. The rotation of the motor 923 is converted into the reciprocating retilinear motion by a micrometer head 922. Further, the motion of the micrometer head 922 is transferred to a wedge stage 921 connected thereto. The wafer 7 is fixed onto the stage 921. When the stage 921 moves, the wafer 7 moves in the optical axis direction by only the distance of ΔW.

The precision which is required for the control movement amount of the wafer 7 is more severe than the precision of the control movement amount of the reticle 5. For instance, when the reduction ratio by the reduction lens 6 is 1/5, precision which is 25 times as high as the precision of the reticle is required. Therefore, the movement amount of the wafer 7 is further corrected by the closed loop control by using a distance measuring apparatus 91 such as an air micrometer or optical autofocusing apparatus. An apparatus used in a conventional semiconductor exposing system can be used as the distance measuring apparatus 91. In step 108, the distance measuring apparatus 91 gives an actual movement amount ΔW' of the wafer 7 to the control unit 8. In step 109, the difference δΔW between the object correction value ΔW and the actual movement amount ΔW' is calculated by $$\delta \Delta W = \Delta W' - W$$

Next, a check is made in step 110 to see if the deviation δΔW from the object correction value is smaller than a permission value ε stored in the memory or not. If the deviation is larger than the permission value, in step 111, the number δNW of correction pulses to be added is determined by $$\delta NW = \delta \Delta W / w$$

Thereafter, the processes in the foregoing steps are repeated until δΔW<ε.

In step 112, the reference wavelength value $\lambda_0$ stored in the memory is rewritten to the actual wavelength value λ. Therefore, the wavelength reference value of λ is used in the next control step. Apparatuses used in the conventional semiconductor exposing system can be used as apparatuses to move the reticle 5 and wafer 7.

Figure 4:
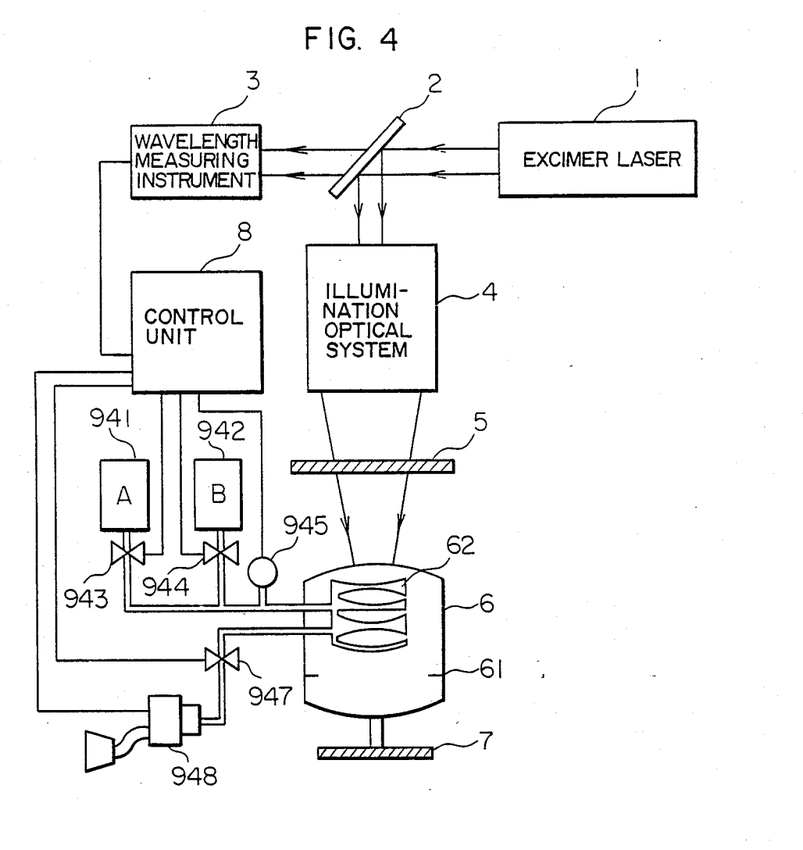
FIG. 4 is a diagram showing a whole arrangement of the second embodiment of a semiconductor exposing system of the invention.

Another embodiment of the present invention will now be described with reference to FIGS. 4 to 6. In this embodiment, a wavelength change of the laser beam is detected and a refractive index of the reduction lens is adjusted in accordance with the wavelength change amount, thereby keeping the focal point position transmitted from the lens constant. In this example, the wafer 7 doesn't need to be moved for correction and also there is no need to correct the magnification by the movement of the reticle. The refractive index of the reduction lens 6 is changed by controlling the component of the gas filled among a group of lenses in the reduction lens 6. In FIG. 4, the same parts and components as those shown in FIG. 1 are designated by the same reference numerals and only the portions different from FIG. 1 will be described.

Figure 5:
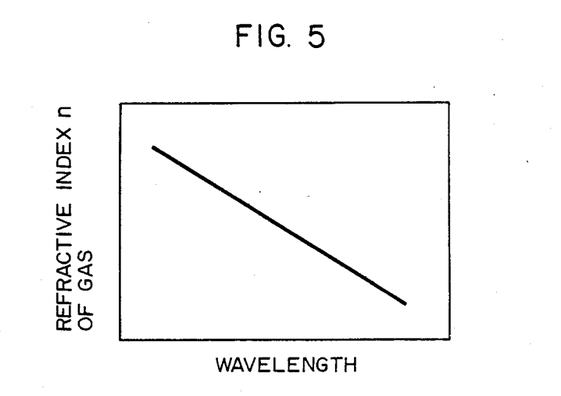
FIG. 5 is a graph showing a refractive index of the gases among a group of lenses for correcting the image forming position and magnification to a fluctuation in wavelength.

FIG. 5 shows the relation between a refractive index n to keep the focal distance and magnification of the lens constant and the wavelength λ. This relation is predetermined by the calculations and stored in the memory in the control unit 8. The refractive index of the gas differs depending on the kind of gas. For instance, for the wavelength of 589.3 nm under the conditions of a temperature of 0° C. and an atmospheric pressure of 1, the refractive index of the air is set to 1.0000292 and that of helium is set to 1.0000035. Further, the refractive index is almost proportional to its partial pressure. The refractive index n of the mixed gases of two kinds of gases A and B is approximated by the following equation.

$$n = kA \cdot PA + kB \cdot PB \qquad (1)$$

where, kA and kB are coefficients and PA and PB are partial pressures of the gases A and B. To avoid a distortion of the group of lenses due to a pressure change, a total pressure $P_0$ of the mixed gases is held constant. Therefore, $$PA + PB = P_0 \qquad (2)$$

From the equations (1) and (2), $$PA = (n - kB \cdot P_0)/(kA - kB) \qquad (3)$$

is derived.

The gases A and B are stored in bombs 941 and 942. By opening and closing electromagnetic valves 943 and 944, the gases A and B are mixed and filled in a space 62 around the group of lenses. A pressure gauge 945 monitors the total pressure of the mixed gases. On the other hand, the mixed gases in the space 62 are exhausted by opening an electromagnetic valve 947 and driving a vacuum pump 948.

Figure 6:
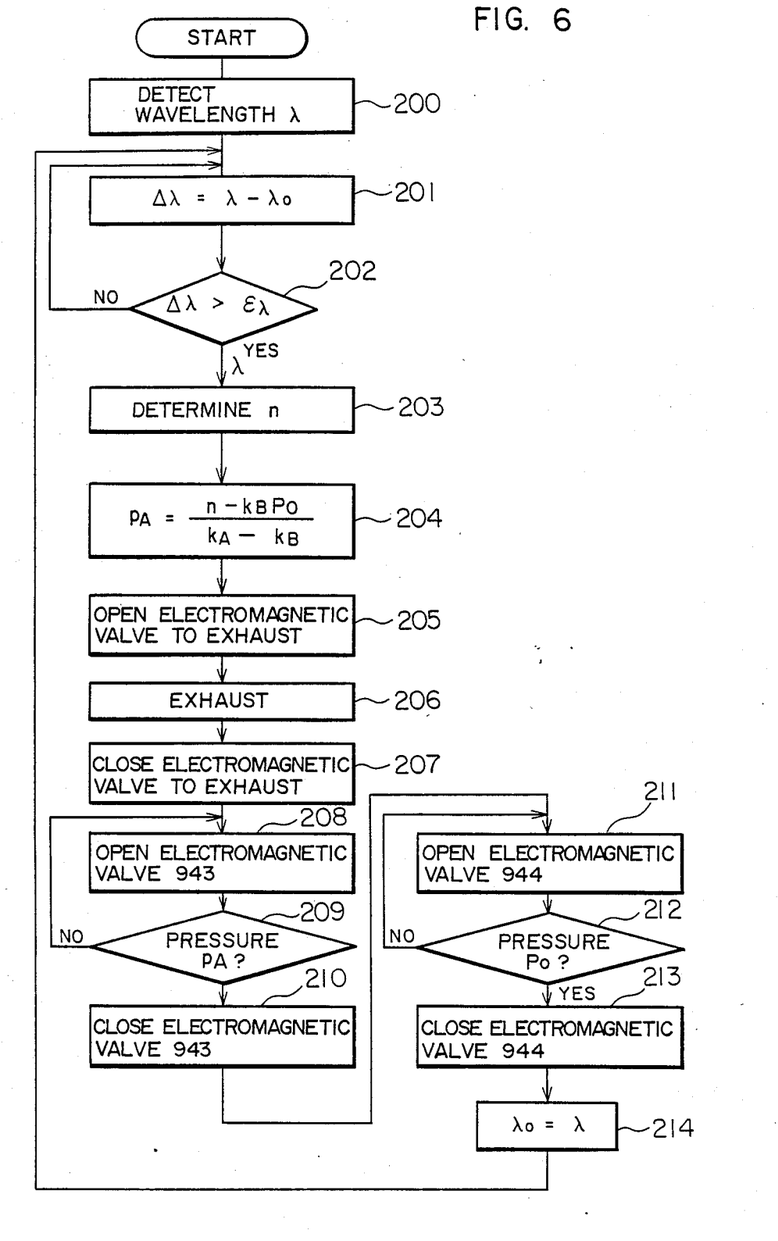
FIG. 6 is a control flowchart for the system of FIG. 4.

A control procedure for the embodiment of FIG. 4 which has been programmed in the microcomputer in the control unit 8 is shown in a flowchart of FIG. 6. In step 200, the value of the actual wavelength λ is read out of the wavelength measuring instrument 3. In step 201, the difference Δλ between the reference wavelength $\lambda_0$ stored in the memory and the actual wavelength λ is calculated. In step 202, a check is made to see if the Δλ is larger than the wavelength fluctuation permission value ελ or not. When Δλ>ελ, in step 203, the refractive index n of the gases filled in the group of lenses for correcting the image forming position and magnification is determined for the wavelength λ by looking up the relation of FIG. 5 stored in the memory. The permission value ελ is stored into the memory and its value is determined from the permission value of the resolution of the pattern to be transferred. In step 204, the partial pressure of the gas A is calculated by the equation (3). In step 205, the electromagnetic valve 947 is opened. In step 206, the vacuum pump 948 is driven to exhaust the gases until the space 62 becomes a vacuum. In step 207, the valve 947 is closed. In step 208, the valve 943 is opened to fill the gas A into the space 62. In step 209, a check is made to see if the pressure gauge indicates PA or not. If it indicates PA, the valve 943 is closed in step 210. In step 211, the valve 944 is opened. In step 212, a check is made to see if the pressure gauge has reached $P_0$ or not. If YES, the valve 944 is closed in step 213. In step 214, the reference wavelength value $\lambda_0$ in the memory is rewritten to λ. The value of λ is used as a reference wavelength value in the next correction control.

Figure 7:
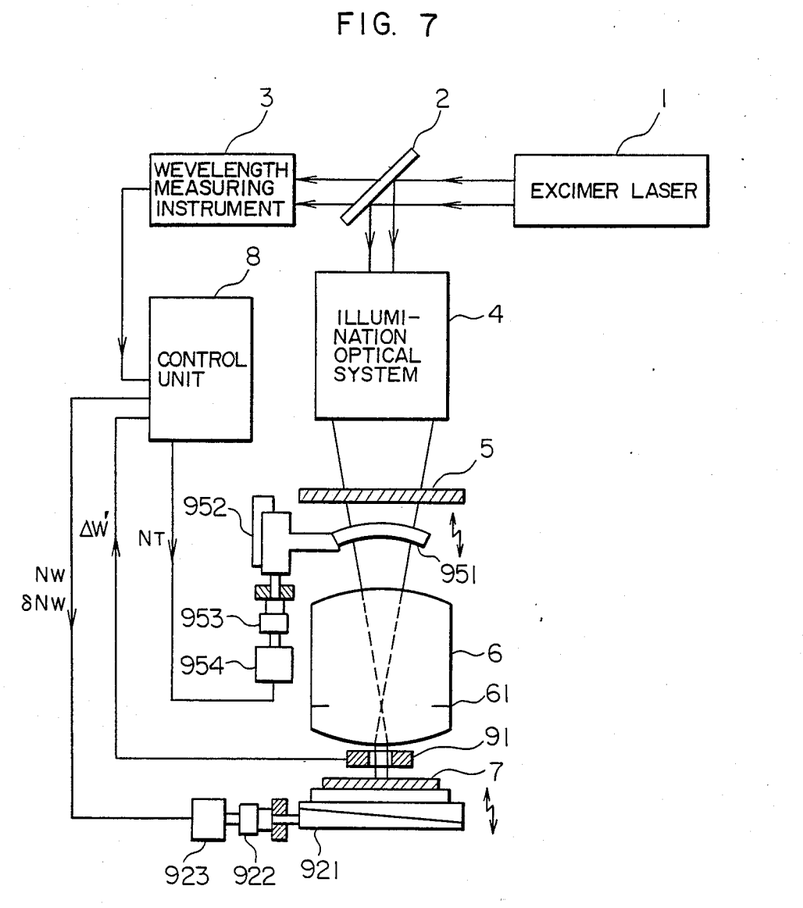
FIG. 7 is a diagram showing a whole arrangement of the third embodiment of a semiconductor exposing system of the invention.
Figure 8A:
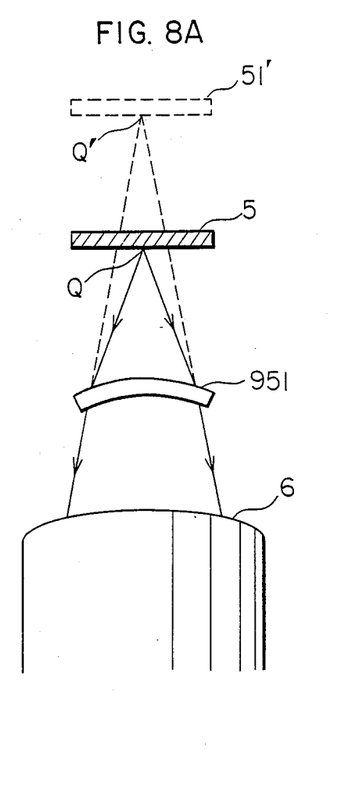
FIGS. 8A and 8B are diagrams for explaining the principle of the correction of a magnification by an auxiliary lens.
Figure 8B:
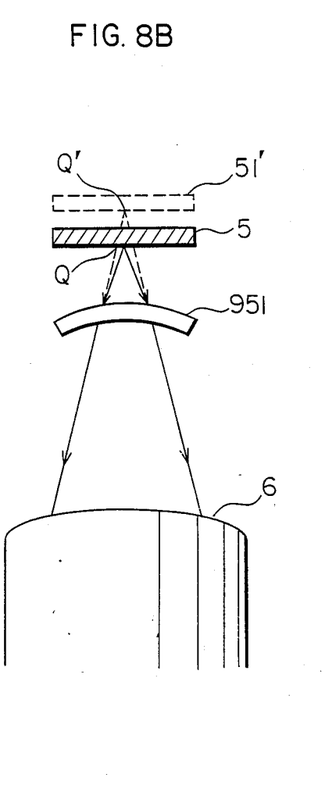

Still another embodiment of the invention will now be described with reference to FIGS. 7 and 8. In FIG. 7, the same parts and components as those in FIG. 1 are designated by the same reference numerals and only the portions different from FIG. 1 will be explained. In this embodiment, a change in wavelength of the laser beam is detected and the position of the auxiliary lens is adjusted in accordance with the wavelength change amount, thereby keeping the magnification to a predetermined value. That is, the auxiliary lens is moved in place of the reticle in the first embodiment.

An auxiliary lens 951 is arranged between the reduction lens 6 and the reticle 5. The auxiliary lens 951 is fixed to a moving stage 952 and is movable in the optical axis direction in association with the movement of the stage 952. The stage 952 is driven by a micrometer head 953 and a pulse motor 954.

When the auxiliary lens 951 moves, the magnification of the whole lens system changes. The principle in this case will now be described with reference to FIGS. 8A and 8B. FIG. 8A shows the case where the auxiliary lens 951 moves in such a direction as to be away from the reticle 5. FIG. 8B shows the opposite case. The light transmitted from one point Q of the reticle 5 is refracted by the auxiliary lens 951 and enters the reduction lens 6. This is equivalent to a state in which the point Q when it is seen from the side of the reduction lens 6 is set to a point Q' of a virtual reticle 51'. This structure can also provide the same effect as that in the first embodiment in which the reticle 5 is moved. Therefore, the magnification can be controlled by moving the auxiliary lens 951 in the optical axis direction. The relation with the movement amount (correction amount) $\Delta T$ of the auxiliary lens 951 in the optical axis direction corresponding to the wavelength change amount $\Delta\lambda$ is predetermined in a manner similar to the relation between $\Delta\lambda$ and $\Delta R$ in FIG. 2. The control method in this embodiment is substantially similar to that described in the first embodiment except that $\Delta R$ is replaced to $\Delta T$.

We claim:

1. An exposure apparatus for exposing a circuit pattern of a mask onto a surface of a substrate by an excimer laser beam comprising:

an excimer laser source for generating the excimer laser beam;

an illumination optical system for illuminating the circuit pattern of the mask with the excimer laser beam from said excimer laser source;

a reduction projection lens for projecting the circuit pattern of the mask onto the substrate with said illuminating excimer laser beam, said illuminating excimer laser beam being passed through the circuit pattern of the mask so as to focus onto a pupil surface of the reduction projection lens, said reduction projection lens being formed by a material incapable of correcting chromatic aberration;

a measuring means for measuring a change amount $\Delta\lambda$ of a wavelength of the excimer laser beam emitted from said excimer laser source; and control means for controlling position of an image plane on which said circuit pattern of the mask is projected through said reduction projection lens by said illuminating excimer laser beam and an image magnification of said circuit pattern of the mask projecting through said reduction projection lens in accordance with said change amount $\Delta\lambda$.

2. An exposure apparatus according to claim 1, wherein said control means includes a first moving means for moving said substrate by a first amount calculated by a calculating means in accordance with said change amount $\Delta\lambda$, said first moving means moving said substrate in a direction of an optical axis of the reduction projection lens, and a second moving means for moving said mask by a second amount calculated by said calculating means in accordance with said change amount $\Delta\lambda$, said second moving means moving said mask in said direction of an optical axis of the reduction projection lens.

3. An exposure apparatus according to claim 1, wherein said control means includes a first moving means for moving said substrate by a first amount calculated by a calculating means in accordance with said change amount $\Delta\lambda$, said first moving means moving said substrate in a direction of an optical axis of the reduction projection lens, and a second moving means for moving an auxiliary lens provided between said reduction projection lens and said mask by a second amount in said direction of optical axis of the reduction projection lens.

4. An exposure apparatus according to claim 1, wherein said control means includes correcting means for correcting a refractive index of the reduction projection lens by controlling partial pressures of a plurality of gases having different refractive indices which are filled around said reduction projection lens.

5. An exposure apparatus according to claim 1, wherein said reduction projection lens includes a plurality of lenses and a container for enclosing said plurality of lenses and a plurality of gases having different refractive indices, said plurality of gases being filled among said plurality of lenses, said control means also including correcting means for correcting a refractive index of the reduction projection lens by controlling partial pressures of said plurality gases.

6. An exposure apparatus according to claim 1, wherein said material is comprised of synthetic quartz.

7. An exposure apparatus according to claim 1, wherein said control means includes means for moving said substrate so that a projecting surface of said substrate is aligned with said image plane.

* * * * *